United States Patent [19]
Brunner et al.

[11] Patent Number: 5,506,153
[45] Date of Patent: Apr. 9, 1996

[54] METHOD FOR MANUFACTURE OF A CONTROLLABLE POWER SEMICONDUCTOR ELEMENT WITH BUFFER ZONE

[75] Inventors: Heinrich Brunner; York C. Gerstenmaier, both of Munich, Germany

[73] Assignee: Siemens Aktiengesellschaft, Munich, Germany

[21] Appl. No.: 489,958

[22] Filed: Jun. 13, 1995

Related U.S. Application Data

[62] Division of Ser. No. 343,670, Nov. 22, 1994, Pat. No. 5,466,951.

[30] Foreign Application Priority Data

Dec. 8, 1993 [DE] Germany .......................... 43 41 879.1

[51] Int. Cl.$^6$ ................................. H01L 21/332
[52] U.S. Cl. ............................ 437/6; 437/31; 437/974; 148/DIG. 126; 148/DIG. 12
[58] Field of Search ................. 437/6, 225, 911, 437/974; 148/DIG. 12, DIG. 135, DIG. 126

[56] References Cited

U.S. PATENT DOCUMENTS

| | | | |
|---|---|---|---|
| 4,517,582 | 5/1985 | Sittig | 257/168 |
| 4,908,328 | 3/1990 | Hu et al. | 148/DIG. 135 |
| 4,916,085 | 4/1990 | Frisina | 437/44 |
| 5,023,691 | 6/1991 | Hagino | 257/139 |
| 5,124,772 | 6/1992 | Hideshima et al. | 257/139 |
| 5,183,769 | 2/1993 | Rutter et al. | 437/6 |
| 5,273,917 | 12/1993 | Sakurai | 148/DIG. 12 |
| 5,286,655 | 2/1994 | Tsunoda | 437/6 |
| 5,360,983 | 11/1994 | Iwamuro | 257/139 |
| 5,443,999 | 8/1995 | Uenishi et al. | 437/6 |

FOREIGN PATENT DOCUMENTS

0330122A1  8/1989  European Pat. Off. .

OTHER PUBLICATIONS

IEEE ransactions on Electron Devices, vol. Ed. 31, No. 6, Jun., 1984, Baliga et al., "Insulated Gate Transistors", pp. 822–828.

IEEE Paper to the 5th International Symposium on Power Semiconductor Devices and IC's M. Mori et al, "A High Power IGBT Module For Traction Motor Drive", pp. 287–291, 1993.

Primary Examiner—Brian E. Hearn
Assistant Examiner—Michael Trinh
Attorney, Agent, or Firm—Hill, Steadman & Simpson

[57] ABSTRACT

Controllable power semiconductor components such as, for example, IGBTs and thyristors are provided, which, compared to known components, have a relatively lightly doped n-buffer zone, a relatively flat p-emitter, and an n-base having a comparatively long charge carrier life expectancy. An advantage is achieved that the controllable power semiconductor component has a temperature-independent tail current, despite a low on-state dc resistance and a high blocking voltage.

4 Claims, 2 Drawing Sheets

METHOD FOR MANUFACTURE OF A CONTROLLABLE POWER SEMICONDUCTOR ELEMENT WITH BUFFER ZONE

This is a division, of application Ser. No. 08/343,670, filed Nov. 22, 1994, U.S. Pat. No. 5,466,951.

BACKGROUND OF THE INVENTION

The invention is directed to a controllable power semiconductor component wherein a cathode-side structure comprises a respective cathode terminal and a gate terminal, an n- base zone, an n buffer zone, and a p emitter zone are electrically contacted to an anode terminal and are provided in sequence.

A controllable power semiconductor component of this type is known from the IEEE paper to the 5th International Symposium on Power Semiconductor Devices and IC's having the title "A High Power IGBT Module For Traction Motor Drive" by M. Mori et al (pp. 287–291). In controllable power semiconductor components such as, for example, IGBT's (insulated gate bipolar transistor) and thyristors, an $n^+$-buffer zone is often provided, for example, between an $n^-$-base zone and a p-emitter. A limitation of the space charge zone is possible as a result thereof and leads to a shorter base, which permits a lower on-state dc resistance. In order to diminish the latch-up tendency and, thus, in order to raise the breakdown voltage, the life expectancy of the charge carriers in the $n^-$-base is shortened, for example by platinum diffusion or electron irradiation, as a result whereof, however, what is referred to as a tail current that is disadvantageously temperature-dependent arises upon shut-off of the controllable power semiconductor component.

SUMMARY OF THE INVENTION

It is an object of the invention to specify a controllable power semiconductor component having low on-state dc resistance in which a tail current that is nearly temperature-independent occurs upon shut-off.

According to the invention, a controllable power semiconductor component comprises a cathode-side structure having a cathode terminal and a gate terminal. An $n^-$-base zone, an n buffer zone, and a p emitter zone are provided in sequence beginning at the cathode-side structure. An anode terminal is electrically contacted to the p-emitter zone. The n buffer zone has a thickness between 20 and 80 μm and a doping concentration at an anode-side edge of $8 \times 10^{13}$ through $5 \times 10^{14}$ cm$^{-3}$. The p-emitter zone has a thickness of 400–1000 nm and a doping concentration at said anode-side edge of $10^{17}$ through $10^{18}$ cm$^{-3}$. The $n^-$ base zone has a life expectancy of the charge carriers that is longer than 10 μsec.

An advantage obtainable with the invention is particularly that no shortening of the life expectancy of the charge carriers, for example, due to a platinum diffusion or an electron irradiation, is required, despite an existing n-buffer layer, and that the controllable power semiconductor components can be manufactured in a technologically simple way for a broad range of current and voltage.

The invention shall be set forth in greater detail below with reference to the drawings.

DESCRIPTION OF THE PREFERRED EMBODIMENTS

Figure 1:
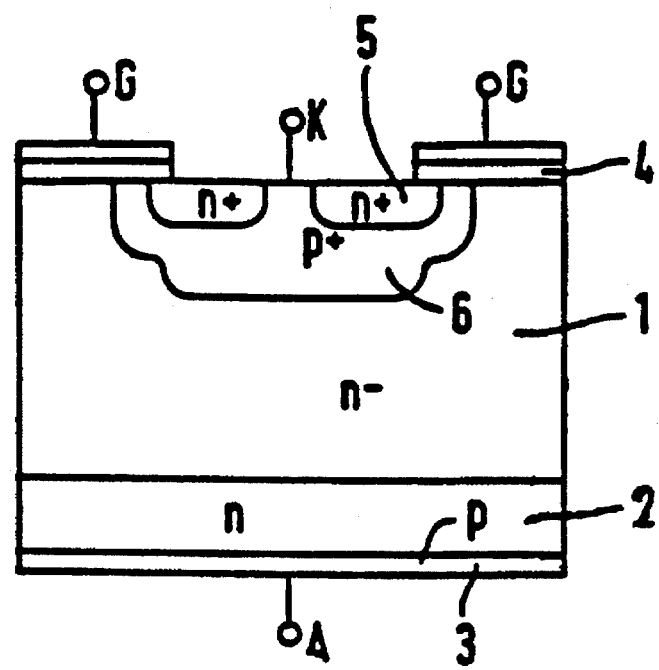
FIG. 1 is a power semiconductor component according to the invention in the form of an IGBT.

FIG. 1 shows a controllable power semiconductor component of the invention in the form of an IGBT (insulated gate bipolar transistor), whereby a cathodeside structure 4 . . . 6, an $n^-$-base zone 1, an n-buffer zone 2 and a p-emitter zone 3 are provided in sequence. The cathode-side structure 4 . . . 6 is comprised therein that at least one $n^+$-doped zone 5 is separated from the $n^-$-base zone 1 by a $p^+$-doped zone 6, and the $p^+$-doped zone 6 is contacted to a cathode terminal K and covers at least one gate electrode which is connected to a gate terminal G and a part of the $n^+$-doped zone 5, a part of the $p^+$-doped zone 6 and a part of the $n^-$-base zone 1. The gate electrode is separated from these regions of the $n^-$-base zone by an insulating layer 4. The p-emitter zone 3 is electrically conductively connected to an anode terminal A.

The dimensions and doping concentrations with respect to the cathode-side structure correspond to those of traditional IGBTs.

The thickness of the $n^-$-base zone 1 can, as usual, be selected at approximately 100 μm per kV, and the doping concentration typically lies between $8 \times 10^{12}$ and $10^{14}$ cm$^{-3}$. Given a typical blocking voltage value of 3 kV, the length of the $n^-$-base and, thus, the substrate thickness as well essentially lies at approximately 300 μm.

In the IGBT of the invention, the n-buffer zone 2 comprises a thickness of approximately 20–80 μm and has a doping concentration of $8 \times 10^{13}$ through $5 \times 10^{14}$ cm$^{-3}$ at the anode-side edge. By comparison to known components, the p-emitter 3 is implemented comparatively flat, has a thickness of 400–1000 nm (typically 600 nm), and comprises a doping concentration of $10^{17}$ through $10^-$cm$^{-3}$ at the anode-side edge.

In any case, the life expectancy of the charge carriers of the $n^-$-base zone 1 is longer than 10 μsec and comprises typical values of 80 μsec since no additional recombination centers are provided. The increase in the life expectancy of the charge carriers in this case has hardly any effect on the charge carrier density, since this is already at a high level.

The doping of the n-buffer zone 2 is thereby selected so low that it has only an extremely slight influence on the injection behavior of the flat p-emitter 3. The dopant quantity of the emitter 3 is selected so slight that practically no charge carrier recombination occurs in the emitter 3, but rather in the metal contact. Consequently, the threshold voltage between the layers 2 and 3—by contrast to known power semiconductor components—can be selected temperature-independent, and the life expectancy of the charge carriers can be selected comparatively long, as a result whereof the semiconductor component of the invention is far less sensitive to temperature fluctuations and the tail current is practically independent of the temperature. The doping of the n-buffer zone 2, however, is adequate in order to avoid what is referred to as a break-through of the space charge zone up to the p-emitter, as a result whereof the ohmic losses in the $n^-$-base are low, even given comparatively high blocking voltages since the base length can be shorter due to the buffer layer 2.

Figure 2:
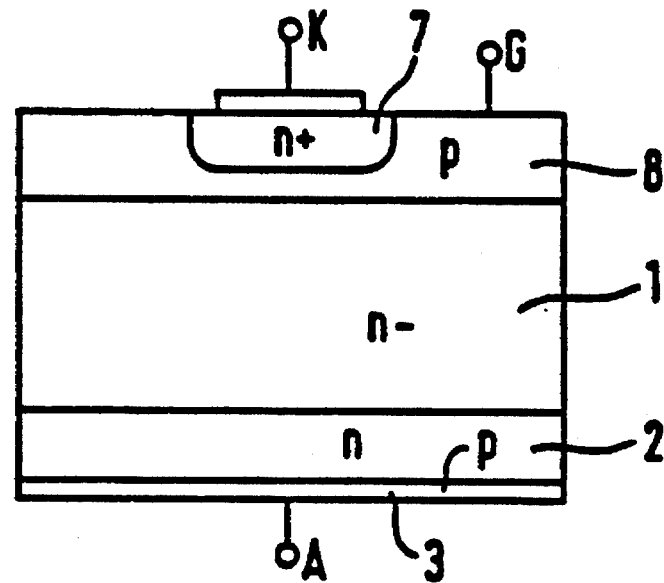
FIG. 2 is a power semiconductor component according to the invention in the form of a thyristor.

FIG. 2 shows an inventive power semiconductor component in the form of a thyristor that differs from the inventive power semiconductor component shown in FIG. 1 on the basis of the cathode-side structure 7, 8. The cathode-side structure 7, 8 is composed of a p-doped zone that is connected to the gate terminal and into which an n$^+$-doped region 7 is introduced, the n$^+$-doped region 7 being electrically contacted to an electrode that is electrically conductively connected to the cathode terminal K.

Figure 3:
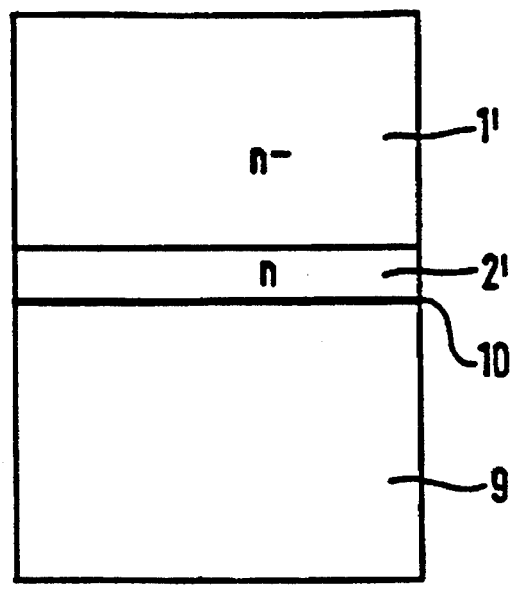
FIG. 3 is an intermediate product in the manufacture of a power semiconductor component of the invention.

In order to explain the method of the invention for manufacturing a controllable power semiconductor component of the invention, FIG. 3 shows an intermediate product that is composed, in sequence, of an n$^-$-doped zone 1', an n-doped zone 2', and of a carrier layer 9. As a rule, the layers 1', 2', and 9 are composed of silicon, whereby the carrier layer 9 can be undoped, or can comprise an arbitrary doping. Typically, the layers 1' and 2' are approximately 300 μm thick together and the carrier layer is likewise approximately 300 μm thick.

Since wafers having diameters of a type that are standard for power semiconductor components can only be poorly processed given this thickness, the n-buffer layer 2', together with the carrier layer 9 (support wafer), are connected to the contact surface 10 between the two layers on the basis of what is referred to as direct wafer bonding.

Further particulars with respect thereto may be derived, for example, from the Japanese Journal of Applied Physics, Vol. 27, No. 12, December, 1988, pages L2364–L2366.

In the manufacture of the controllable power semiconductor component of the invention, a wafer composed of an n$^-$-doped silicon substrate 1' is employed as an initial material. The n-buffer layer 2' is produced either by epitaxial growth or by drive-in of, for example, phosphorous atoms into the n$^-$-substrate. As shown in FIG. 2, this is followed by the joining of the wafer composed of the n$^-$-doped silicon substrate and the further wafer 9 that serves as a carrier substrate. The joined wafers 1' and 9 now comprise an adequate thickness and can thus be supplied to a further process step for producing the respective cathode-side structure. The production of the respective cathode-side structure occurs in a known way, for example, by diffusion. Since the further wafer serves only as a carrier substrate, it is removed by grinding after the cathode-side structure has been produced. For improving the surface properties, the grinding process can potentially be followed by an etching step. In conclusion, the p-emitter zone 3 is produced by implantation from the ground and a potentially etched surface, whereby the implantation occurs in a known way.

Figure 4:
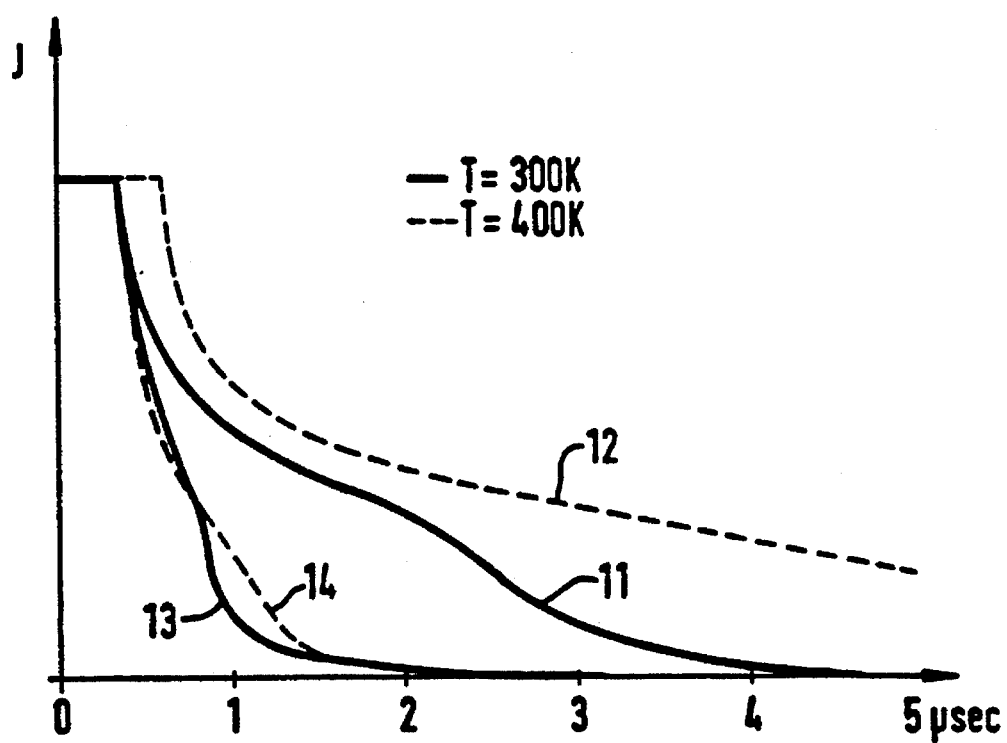
FIG. 4 is a current/time diagram for a power semiconductor component of the invention and for a power semiconductor component of a known type at two different temperatures.

FIG. 4 shows a diagram of the chronological curve of the load current I in a time interval between 0 and 5 μsec after shut-off. The current curves 11 . . . 14 are shown there and wherein: curve 11 corresponds to a comparable, conventional power semiconductor component at a temperature of T=300 K; curve 12 corresponds to the comparable, conventional power semiconductor component at a temperature T=400 K; curve 13 corresponds to a power semiconductor component of the invention at the temperature of T=300 K; and curve 14 corresponds to the power semiconductor component of the invention at a temperature of T=400 K.

It becomes clear that the curves 13 and 14 decay to the value 0 significantly faster than the curves 11 and 12, and that the curves 13 and 14, by contrast to the curves 11 and 12, are largely identical, i.e. temperature-independent. A significantly slower drop in current occurs in curve 12, and even the beginning of the drop occurs later than in curve 11.

Although various minor changes and modifications might be proposed by those skilled in the art, it will be understood that I wish to include within the scope of the patent warranted hereon all such changes and modifications as reasonably come within my contribution to the art.

I claim as my invention:

1. A method for manufacturing a controllable power semiconductor component, comprising the steps of:

providing a wafer of n$^-$-doped silicon as a substrate;

applying an n-buffer zone onto the substrate by epitaxy;

connecting the n-buffer zone to a further silicon wafer by bonding in order to enhance mechanical stability;

producing a cathode-side structure in the n$^-$-doped silicon substrate and providing a cathode terminal on the cathode-side structure along with a gate terminal and gate electrode, said n$^-$-doped silicon substrate serving as a base zone;

removing said further silicon wafer by grinding; and providing a p-emitter zone adjacent to said n-buffer zone by implantation into said n-buffer zone, and providing an anode terminal at said p-emitter zone.

2. A method according to claim 1 including the step of providing the n-buffer zone with a thickness between 20 and 80 μm and a doping concentration at an anode-side edge of $8 \times 10^{13}$ through $5 \times 10^{14}$ cm$^{-3}$;

providing said p-emitter zone with a thickness of 400–1000 nm and a doping concentration at an anode-side edge of $10^{17}$ through $10^{18}$ cm$^{-3}$; and providing said n$^-$-base zone with a life expectancy of charge carriers that is longer than 10 μsec.

3. A method for manufacturing a controllable power semiconductor component, comprising the steps of:

providing a wafer of n$^-$-doped silicon as a substrate;

producing an n-buffer zone in the substrate by drive-in of phosphorous atoms;

connecting the n-buffer zone to a further silicon wafer by bonding in order to enhance mechanical stability;

producing a cathode-side structure in the n$^-$-doped silicon substrate and providing a cathode terminal on the cathode-side structure along with a gate terminal and gate electrode, said n$^-$-doped silicon substrate serving as a base zone;

removing said further silicon wafer by grinding; and providing a p-emitter zone adjacent to said n-buffer zone by implantation into said n-buffer zone, and providing an anode terminal at said p-emitter zone.

4. A method according to claim 3 including the step of providing the n-buffer zone with a thickness between 20 and 80 μm and a doping concentration at an anode-side edge of $8 \times 10^{13}$ through $5 \times 10^{14}$ cm$^{-3}$;

providing said p-emitter zone with a thickness of 400–1000 nm and a doping concentration at an anode-side edge of $10^{17}$ through $10^{18}$ cm$^{-3}$; and providing said n$^-$-base zone with a life expectancy of charge carriers that is longer than 10 μsec.

* * * * *